(12) United States Patent
Jan

(10) Patent No.: US 6,303,855 B1
(45) Date of Patent: Oct. 16, 2001

(54) PACK DESIGNED TO TAKE, IN PARTICULAR, AN ELECTRICAL AND/OR ELECTRONIC BOARD, METHOD FOR THE MANUFACTURE AND ASSEMBLY OF A SYSTEM COMPRISING A CORRESPONDING PACK AND BOARD

(75) Inventor: Marc Jan, Montreuil-Boiley (FR)

(73) Assignee: Avaya Technology Corp., Basking Ridge, NJ (US)

(*) Notice: Subject to any disclaimer, the term of this patent is extended or adjusted under 35 U.S.C. 154(b) by 0 days.

(21) Appl. No.: 09/464,980

(22) Filed: Dec. 16, 1999

(30) Foreign Application Priority Data

Dec. 23, 1998 (EP) .................................................. 98460061

(51) Int. Cl.[7] ...................................................... H05K 9/00
(52) U.S. Cl. ......................... 174/35 R; 361/800; 361/801
(58) Field of Search ........................ 211/41.17; 361/801, 361/747, 752, 759, 796, 800; 174/35 R

(56) References Cited

U.S. PATENT DOCUMENTS

| | | | |
|---|---|---|---|
| 5,796,593 | * | 8/1998 | Mills et al. ........................... 361/801 |
| 5,953,217 | * | 9/1999 | Klein et al. .......................... 361/799 |

FOREIGN PATENT DOCUMENTS

| | | |
|---|---|---|
| G9103080.13 | 3/1991 | (DE) . |
| 05041592 | 2/1993 | (JP) . |
| 05136578 | 6/1993 | (JP) . |

* cited by examiner

Primary Examiner—Shawn Riley
(74) Attorney, Agent, or Firm—Lester H. Birnbaum; Thomas J. Bean

(57) ABSTRACT

A pack houses an electrical and/or electronic board. The pack includes positioning structures that support the board. At least one of the positioning structures provides an electrically conductive path to an element located on the board, and has elastic properties that assist the positioning structure to maintain mechanical and electrical contact with the element.

8 Claims, 4 Drawing Sheets

PACK DESIGNED TO TAKE, IN PARTICULAR, AN ELECTRICAL AND/OR ELECTRONIC BOARD, METHOD FOR THE MANUFACTURE AND ASSEMBLY OF A SYSTEM COMPRISING A CORRESPONDING PACK AND BOARD

CROSS-REFERENCE TO RELATED APPLICATION

This application claims priority of European Patent Application No. 98460061.9 which was filed on Dec. 23, 1998.

BACKGROUND OF THE INVENTION

The field of the invention is that of packs and other cases for the reception and plugging-in of electronic boards, and more generally the field of the manufacture of packs and/or the mounting in the pack of various elements requiring mutual mechanical and electrical contact.

Referring specifically to the techniques of mounting an electronic board in a pack, there are several known systems for the mounting and fixing of boards in a pack. As shall be seen, these techniques are generally accompanied by means for the electrical connection of certain zones of the board with certain zones of the pack, for example a "ground".

Hereinafter in the present description the following terms shall be defined as follows:

"positioning" is the action of placing an element in a state where it applies stress to one or more mechanical stops;

"fixing" an element is the action of immobilizing this element or holding it fixedly still;

a "pack" is a container comprising at least one face.

FIG. 1 shows a known technique for the mounting of an electronic board inside a pack 10 by means of several positioning and fixing elements. These various elements include electrically conductive spacers 11 made at the very bottom of the pack 10 as well as non-conductive spacers 12 inserted in apertures made at the bottom of the pack 10. Each conductive spacer 11 is made out of an element cut out in the bottom of the pack, vertically lifted at right angles and provided with a horizontal notch designed to work with an aperture included in the board and enabling electrical contact with the upper face of the electronic board. The conductive spacers 13 are for their part formed by a tapped cylinder in which a screw (not shown) is inserted to fixedly hold the electronic board. Each conductive spacer 13 and each screw also work with each other to form an electrical contact against the lower face (by the conductive spacer 13) and against the upper face (by the screw) of the electronic board.

However, this principle of mounting an electronic board in a pack has few advantages. Indeed, this assembly is complex because it requires the prior shaping and/or the fastening of a large number of different independent and specific elements, both on the board and in the pack. It is necessary to use certain screwed-in elements. As a result, the processes of shaping these different specific elements and assembling them gives rise to cumbersome methods and substantial assembly times and hence to correspondingly high costs.

There is another known method of mounting an electronic board within a pack, which consists of the use of one more electrically conductive, elbowed spacers, made at the bottom of the pack, each spacer being for example formed by a slot cut out in a part of the bottom of the pack. This slot is elongated and then bent at two places to form an inverted "L" overhanging the bottom of the pack. The upper horizontal part of the "L" is then drilled and tapped to receive a screw in order to position, fix and form an electrical contact against the lower face (by means of the conductive spacer itself) and against the upper face (by means of the screw) of the slot.

This approach also has certain drawbacks. First of all, the technique of manufacturing a spacer of this kind requires the use of several distinct tools, including especially a punch and a tap. The manufacture of a pack provided with several spacers of this kind is complicated owing to the precision that it requires (especially in the positioning of the drilled hole or holes in the spacers that have to take a screw) and is therefore costly.

Then, the manufacture of each spacer requires a plurality of operations and especially a cutting-out operation, two folding operations, one drilling operation and one tapping operation. Carrying out all these operations requires corresponding time of execution.

Furthermore, an assembly of the board in a pack of this kind requires the vertical positioning of the board followed by a precise positioning of one or more holes provided in the board before the holes drilled in the spacers to introduce and then screw in the screws. An assembly therefore requires firstly adjusting precision, (especially the positioning of the holes made in the board facing the holes in the spacer) and secondly, the use of tools (including especially a screwdriver).

Finally, the dismounting of the board from the pack also requires the use of tools (especially a screwdriver). This dismounting therefore implies considerable time of execution which particularly increases the cost of maintenance of the electronic board.

It is a goal of the present invention in particular to overcome these different drawbacks of the prior art.

SUMMARY OF THE INVENTION

The invention is a pack designed to receive at least one electronic board of the type comprising positioning and fixedly holding structures in said pack, where at least one such structure comprises at least two supporting elements, at least one of said supporting elements being elastic, and at least one of said supporting elements comprises a conductive part designed to co-operate electrically with at least one additional element located on said board.

BRIEF DESCRIPTION OF THE FIGURES

Other features and advantages of the invention should appear from the following description of a preferred embodiment of the invention, given by way of a simple illustrative and non-restrictive example, with reference to appended drawings, of which.

DETAILED DESCRIPTION

Figure 1:
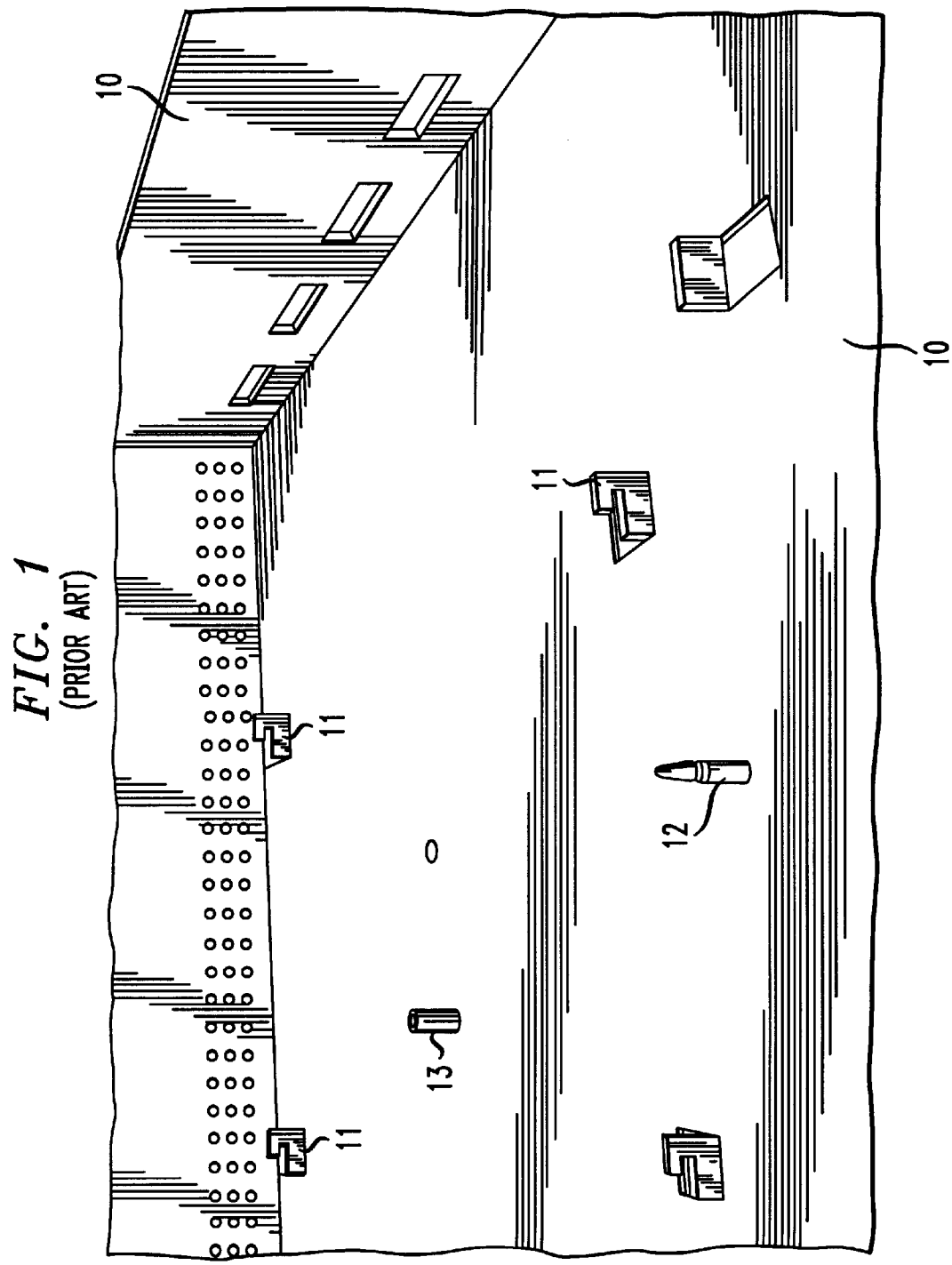
FIG. 1 which has already been described in the introduction, shows a diagrammatic view in perspective of a known pack provided with means enabling the reception of an electronic board.

The main principle of the invention relies on the use of simple supporting elements, at least one of which has a mechanical elasticity providing for fixed holding by securing or "wedging", and at least one (the same and/or another element) of which provides an electrical connection with a pre-determined zone of the board. An elasticity of this kind ensures that the concerned supporting elements have a permanent mechanical contact (and, as the case may be, electrical contact) with the board with which they are co-operating.

It will indeed be understood that certain elastic support elements may also be electrically conductive so that the pack remains permanently in mechanical contact and in electrical contact with the board.

Advantageously, said supporting elements co-operate in pairs, a first of said supporting elements coming into mechanical contact against a zone of the lower face of said board and a second of said supporting elements coming into mechanical contact against a zone of the upper face of said board.

It is the association of at least one first supporting element which, by means of its elasticity, pushes the board away from one face, (or possibly from one side) against a second supporting element located on the opposite face (or the opposite side respectively) that enables the board to be kept wedged against at least certain supporting elements. A wedging of this kind enables the board to be positioned and held fixedly still.

Thus, it is in no way necessary to use additional positioning and/or fixed holding means that are external to the pack, specific and/or attached between the pack and the board.

Preferably, said first of said supporting elements is elastic and said second of said supporting elements is rigid.

In this way, the elastic supporting elements placed beneath the board places the board flat against the rigid supporting elements located above the board without any spacing (or clearance) arising between the board and at least certain supporting elements.

Advantageously, at least one of said supporting elements forms an integral part of said face of the pack.

According to a preferred embodiment of the invention, at least one of said supporting elements is formed by an element cut out of said face of the pack and folded with respect to said face of the pack from which it is cut out.

Preferably, at least one of said cut-out elements is shaped with dimensions and folding angles such that it forms a tongue that is elastically mobile with respect to said face in which it is cut out.

A characteristic of elasticity of this kind enables the supporting elements concerned to retain permanent mechanical and/or electrical contact with the board, without having any clearance.

In an particular embodiment of the invention, said folding angle ranges from 2 to 70 degrees.

Preferably, the length of said elastically mobile tongue is at least 3 times greater than the width of this same tongue, said width of this tongue being itself at least 3 times greater than the thickness of said tongue.

It is clear that the dimensions are a function of the nature of the material constituting the pack and the conformation of the supporting elements in question.

According to a particular embodiment of the invention, at least one cut-out element has an "L" shape, one of the arms of said "L" shape being located in the plane of said face of the pack in which it is cut out, so that said arm of said L shape in the plane of said face of the pack is elastically mobile.

In one particular embodiment of the invention, at least one cut-out element has, in a plane perpendicular to said face of the pack in which it is cut out, a face shaped as an "L" whose external end terminates in a folded part so that at least one of the arms of said face shaped as an "L" and/or said folded part is (are) elastically mobile.

It will be understood that a shaping of this kind of the cut-out element or elements is advantageously provided for one or more lateral faces of the pack.

Advantageously, said complementary element of said board designed to co-operate with a supporting element of the pack is formed by an electrical contact zone.

It is clear that these electrical contact zones are provided at a place of the board facing said peripheral zones of the supporting elements that have to make contact.

Preferably, said supporting elements, comprising an electrically conductive part and forming a ground connection of said board on said pack, are sufficient in number on a pre-determined surface and distributed in the lower and upper faces of said board, so as to provide protection in transmission and reception against electromagnetic pollution.

The invention also relates to a method for the manufacture of a pack as described here above, wherein the pack comprises at least one continuous face, said method for the manufacture of a pack comprising:

cutting out, in said face, at least two elements designed to form supporting elements, a folding of each of the cut-out elements with respect to the face in which it is cut out, at least one of said elements being cut out in dimensions and being folded at a folding angle such that it forms a tongue that is elastically mobile with respect to said face in which it is cut out, and at least one of said elements comprising a conductive part designed to work electrically with at least one complementary element located on said board.

Thus, the manufacture of a board requires only one tool, namely for example a press.

It will be noted that the cutting-out and folding steps can be performed in one of the same movements.

Furthermore, the manufacture of a pack of this kind requires a number of operations that is smaller than in the prior art, therefore reduces the cost of manufacture of the pack.

Finally, the elasticity of at least one supporting element permits greater tolerance in its dimensions than those required for the rigid fastening means of the prior art. In this way, the elements are easier to make since the required precision is lower than in the prior art. Elements of this kind are therefore less costly to manufacture than in the prior art.

The invention also relates to a method for the assembly of electronic systems comprising at least one pack as described here above and at least one electronic board comprising:

making, on said board, of at least one electrical contact zone, said contact zone being designed to co-operate with a supporting element of the pack;

the positioning and fixed holding of said board in said pack comprising the insertion, in an essentially horizontal position, of said board between at least two of said supporting elements, at least one of said supporting elements being elastic, and at least one of said supporting elements comprising a conductive part designed to work electrically with said electrical contact zone located on said board.

In this way, a simple horizontal shifting of the board is enough to introduce it between the supporting elements within the pack. Indeed, it is the supporting elements that take charge of positioning the board vertically.

Furthermore, there is no need to provide for any tool (such as for example a screwdriver) to fix the board.

The invention therefore relates to a pack designed in particular to receive at least one electronic board making it possible essentially to avoid the use of external additional positioning and/or fixing means. This pack furthermore permits the mounting and/or dismounting of the electronic board or boards provided within the pack in a manner that is simple and fast as compared with the prior art.

The pack may be for example a rack, a housing and/or an electrical and/or electronic cabinet.

Figure 2:
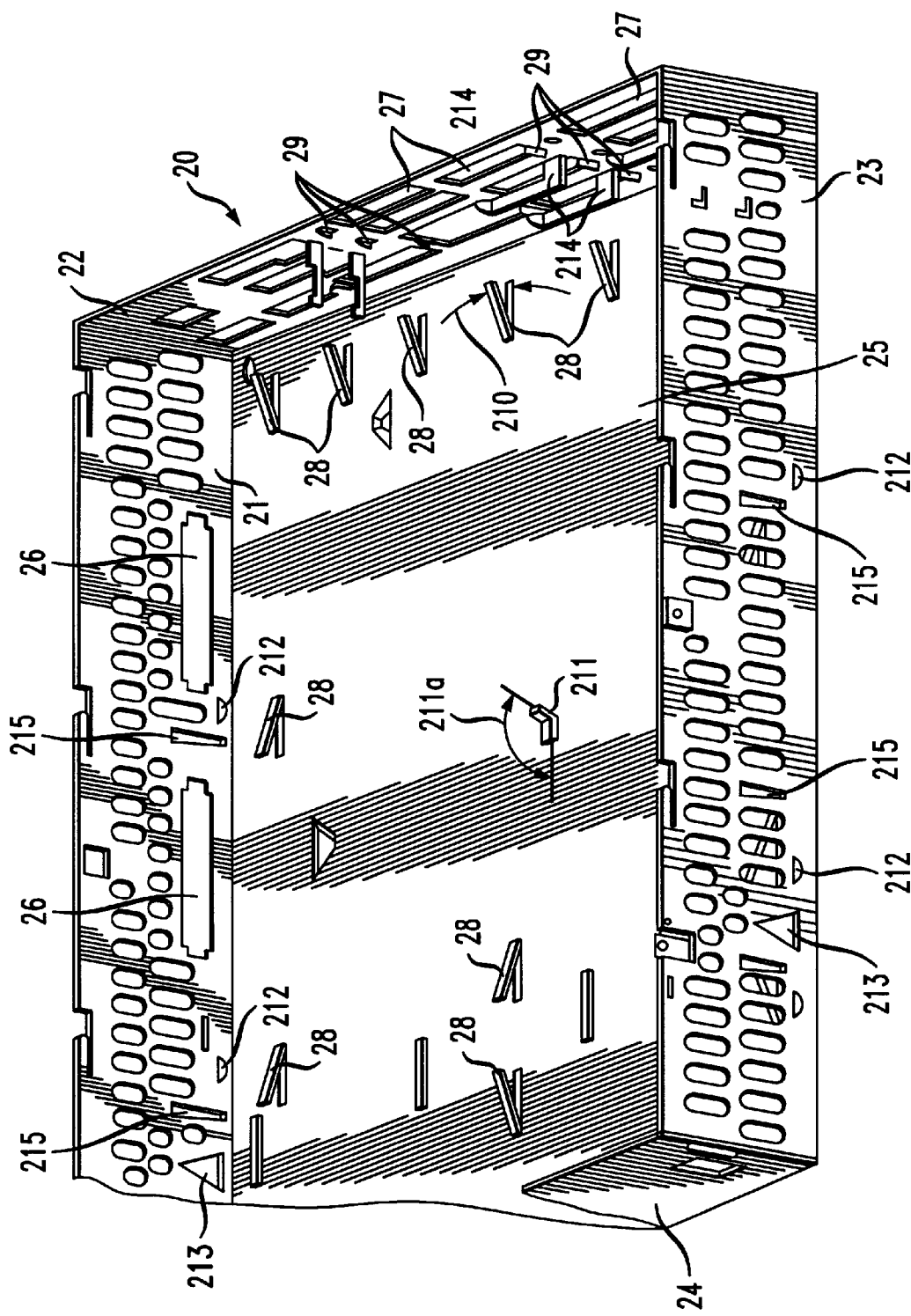
FIG. 2 is a partial simplified diagrammatic view in perspective of a pack provided with a system for the mounting of a plurality of boards according to the invention.

A preferred embodiment of the invention shall now be described with reference to the simplified diagram of FIG. 2.

In a standard way, the pack 20 designed especially to receive at least one electronic board (not shown) may consist of a plurality of continuous faces 21 to 25, including for example lateral faces 21 to 24 and a bottom 25. The lateral face referenced 21 has holes 26 enabling the positioning of board connectors, for example of the PCMCIA type. The lateral face referenced 22 also has apertures 27 designed for example to receive telephone and/or fax connectors.

This type of pack 20 comprises integrated structures, for the positioning and fixed holding of several electrical and/or electronic boards that may be connected to each other through appropriate connectors (not shown).

According to the invention, the structures comprise at least two supporting elements 28, 29 of which at least one, referenced 28, is elastic and at least one of these supporting elements 28, 29 has a conductive part designed to co-operate electrically with at least one additional element located on the board. Thus, in the example described here below, the equipping of the bottom 25 of the pack 20 with elastic supporting elements 28 enables a first board (not shown), called a mother board, to rest (by its weight) on these supporting elements 28. These supporting elements 28 push back the mother board towards the supporting elements 29 by means of an opposite reaction (namely a reaction in the opposite direction) to the action of the weight exerted by the mother board.

It will be understood that the intensity of the opposite reaction depends firstly on the mass of the mother board and secondly on the resistance of the material or materials forming these supporting elements 28 as well as the way in which these elements are shaped.

The weight of the mother board forces elements 28 to get deformed elastically. The deforming of the supporting elements 28 depends firstly on a deformation coefficient proper to the material or materials forming the supporting elements 28 and secondly also to the shaping of the supporting elements 28.

The thrust action exerted by the elastic supporting elements 28 therefore enables the mother board to be held up against the rigid supporting elements 29 and/or rigid supporting elements referenced 215, leading to a vertical blocking of the mother board.

The elastic supporting elements 28 therefore form mechanical contacts with the mother board. However, the supporting elements 28 may also form electrical contacts with supporting zones of this same board. To do this, each of these supporting zones has, for example, an electrical contact zone.

The pack 20 comprises a conductive material such as for example metal in order to form a Faraday cage and/or a metalised connecting layer. It is clear that if the mechanical contact zones of the supporting elements 28 are not to provide electrical contact, they would be devoid of conductive material.

In order to fix the mother board on its rear part, namely on the side of the lateral face referenced 24, the lateral faces referenced 21 and 23 comprise supporting elements 215 which also get deformed elastically. Supporting elements 215 of this kind have a shape identical or similar to that of the elastic supporting elements 28 (described further above). However, the supporting elements 215 are used, unlike the elastic supporting elements 28, firstly to prevent the mother board (located beneath the elastic tongues 215) from rising up and/or getting longitudinally deformed (owing to forces of unequal intensity that may be exerted on it) and secondly to guide the mother board when it is being fixed to the pack 20.

The supporting elements 29, 215 are rigid in the direction of action of the supporting elements 28, namely in the direction of the thrust that they exert vertically from bottom to top. The supporting elements 29, 215 in particular have a part on their lower peripheral that is also electrically conductive. This electrically conductive part is designed to work with the complementary element located on the board to be put into contact. The complementary element is formed by an electrical contact zone. Each electrical contact zone comprises a pre-determined zone of the board that is covered with a layer, for example of tin-plated and/or processed copper.

Preferably, the supporting elements 28, 29 and/or 215 work in pairs, the first supporting elements 28 coming into mechanical contact with a zone of the lower face of the mother board and second of the supporting elements 29, 215 coming into mechanical contact with a zone of the upper face of the mother board. The mother board is trapped between the supporting elements 28, 29, 215 which are equally distributed on either side especially of the front part as well as the sides of the mother board, namely close to the side face 22 and close to the side faces 21 and 23 respectively. The elastic supporting elements 28 push the mother board towards the rigid supporting elements 29, 215 enabling this board to be wedged without any clearance being interposed between the supporting means 28, 29 and/or 215 and the mother board. The supporting elements 28, 29 and/or 215, by working together and automatically (through the elasticity of the supporting elements 28), adapt to the thickness of the mother board so as to position it essentially vertically and fix it.

The elastic supporting elements 28 form an integral part for example of the bottom 25 of the pack 20 while the rigid supporting elements 29, 215 form an integral part for example of the lateral faces referenced 21, 22, 23 of this same pack 20. In this way, the invention averts especially any difficulty and/or risk of poor mechanical and/or electrical connection due for example to the interposing of attached additional means, between the mother board and the part 20.

To do this, at least some of the elastic or rigid supporting elements 28, 29, 215 are each formed by an element that may be cut out for example in the bottom 25 and/or in the face or faces 21, 22, and/or 23 and folded with respect to the bottom 25 and/or the side face or faces 21, 22 and/or 23 in which it is or they are cut out.

At least one of the elements cut out for example in the bottom 25 of the pack 20 is shaped to dimensions and a folding angle 210 such that it forms a tongue 28 that is elastically mobile with respect to the bottom 25 of the pack 20 from which it is cut out.

The supporting elements 28, 29 and/or 215 which form an electrically conductive part form a ground connection of the mother board on the pack 20.

In an advantageous embodiment of the invention, the supporting elements 28, 29 and/or 215 comprising an electrically conductive part are sufficient in number on a predetermined surface and distributed on the lower and upper faces of the mother board so as to provide protection in transmission and reception against electromagnetic pollution. In other words, the density of electrical contacts between the pack 20 and the mother board, formed by the conductive supporting elements 28, 29 and/or 215, is such that the reference voltage, mainly the ground voltage, is clean, namely the parasitic voltages are reduced to the utmost or even completely eliminated. Thus, the efficiency of the electromagnetic protection generated is raised by increasing the number of electrical contacts in alternation between the elastic supporting elements 28 placed beneath the mother board (which push the board in a vertical direction from bottom to top) and the rigid supporting elements 29, 215 placed above the mother board.

Furthermore, one of the elements 211 cut out in the bottom 25 of the pack 20 make it possible to prevent the weight of the mother board from giving rise to any excessive deformation of the elastic supporting elements 28 by maintaining a certain distance from the bottom 25 of the pack. A distance of this kind is dictated by the length of the folded part of the cut-out element 211. An excessive deformation would indeed prevent the elastic supporting elements 28 from pushing back the mother board. To do so, the folding angle 211 of the cut-out elements is approximately equal to 90 degrees with respect to the bottom 25 of the pack 20 in which they are cut out. This cut-out element or these cut-out elements 211 are used as bottom safety stops, i.e. there is no mechanical contact between these cut-out elements 211 on the mother board in the normal operating position of the assembly (constituted in the present example by at least two electronic boards.)

Furthermore, it is also possible, on the lateral faces referenced 21 and 23, to provide elements 212 forming a bottom safety stop for the mother board and, elements 213 forming a rear stop of the mother board. In this way, the mother board is fixed vertically through all the elements 28, 29 and/or 215 and horizontally on all sides (through the lateral faces referenced 21, 22 and 23 and stop elements 213).

In order to fix at least one second board (not shown) called a daughter board (because it is driven by the mother board) in the pack 20, it is possible to envisage a case where at least one cut-out element 214 (described in detail further below) of the lateral face referenced 22 has, in a plane perpendicular to the lateral face 22, an "L" shaped face whose outer end terminates in a folded part so that at least one of the arms of the "L" shaped face and/or the folded part is/are elastically mobile. It is these elements 214 that push the daughter board from bottom to top to other rigid supporting elements 29 and/or rigid supporting structures (not shown) identical to the supporting elments referenced 215 placed above the daughter board.

Figure 3:
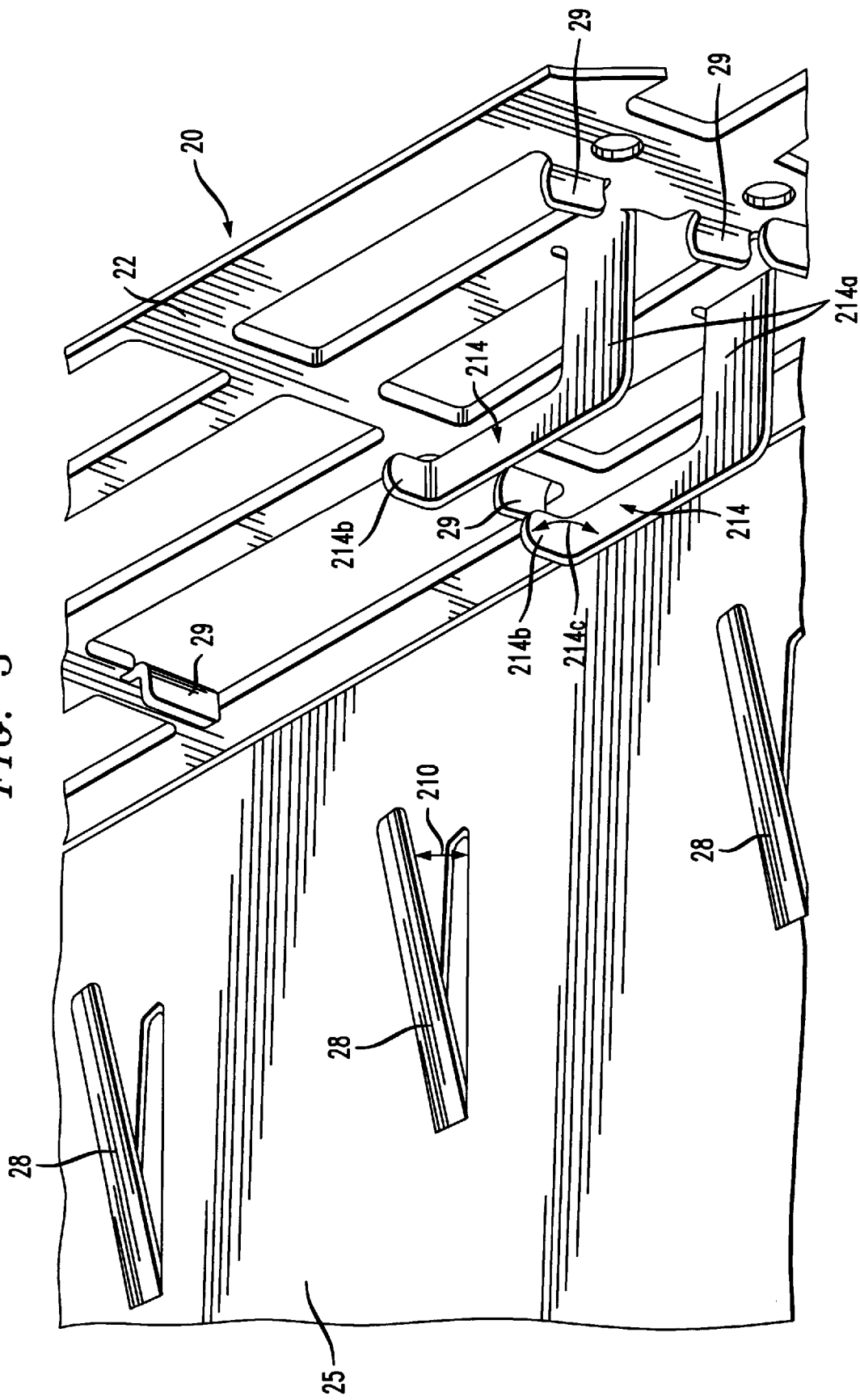
FIG. 3 is a simplified and detailed drawing of a zone showing certain positioning and fixedly holding structures in the pack of FIG. 2.

Referring to the simplified diagram of FIG. 3, a description is now given of the elements 28, 29 and/or 215 and 214 positioning and fixedly holding the pack 20.

It may be recalled that it is the elasticity of the supporting elements 28 concerned that enable a permanent mechanical and/or electrical contact to be kept with the mother board, in this case without any spacing between the board and the supporting elements 28, 29 and/or 215. A spacing of this kind has the drawback, in certain conditions of operations (especially during tremors produced within the pack 20) of possibly giving rise to mechanical friction between the supporting elements 28, 29 and/or 215 and the mother board. A mechanical friction of this kind in a conductive part may possibly give rise to the loss of the electrical contact.

In order to ensure the elasticity of the elastic supporting elements 28, their respective folding angle 210 ranges from 2 to 70 degrees.

As for the dimensions of the mobile tongue 28, they are naturally dependent on the nature of the material forming the pack 20. For example, in the case of a pack 20, made of metal such as galvanised steel, the length of the elastically mobile tongue 28 is at least 3 times greater than its width, which is itself at least 3 times greater than the thickness of the tongue 28.

According to one variant (not shown) of the elastic supporting element 28, at least one element has an "L" shape, one of the "L" shaped arms being located in the plane of said face of the pack in which it is cut out so that said arm of said "L" shape in the plane of said face of the pack is elastically mobile. In other words, the cut-out element has a first elastically mobile part (forming the first arm of the "L") located in the prolongation of the plane formed by the face in which it is cut out and a second rigid part (forming the second arm of the "L") located in the plane perpendicular to the plane formed by the face in which it is cut out. To do so, the dimensions of the first part are naturally adapted from a elastically mobile tongue.

As mentioned here above, the rigid supporting elements 29 are formed out of an element cut out in a lateral face 22 of the pack 20 and folded towards this same face 22.

Furthermore, the folding angle 214c within each cut-out element 214, is equal for example to about 90 degrees between the folded part 214 and the "L" shaped part 214b. A shaping of the cut-out element or elements 214 such as this is valuable for keeping a daughter board (in the present example) within the pack 20 at a certain distance from the lower and/or upper face or faces 25 (not shown) of the pack 20. It is the end part of the folded part 214b of the cut-out element 214 that forms a mechanical contact and/or an electrical contact with the daughter board by its lower face. Just like the supporting elements 28, the cutout elements 214 are elastic and also work in pairs with one of the rigid supporting elements 29 so as to fixedly hold the daughter board.

Figure 4:
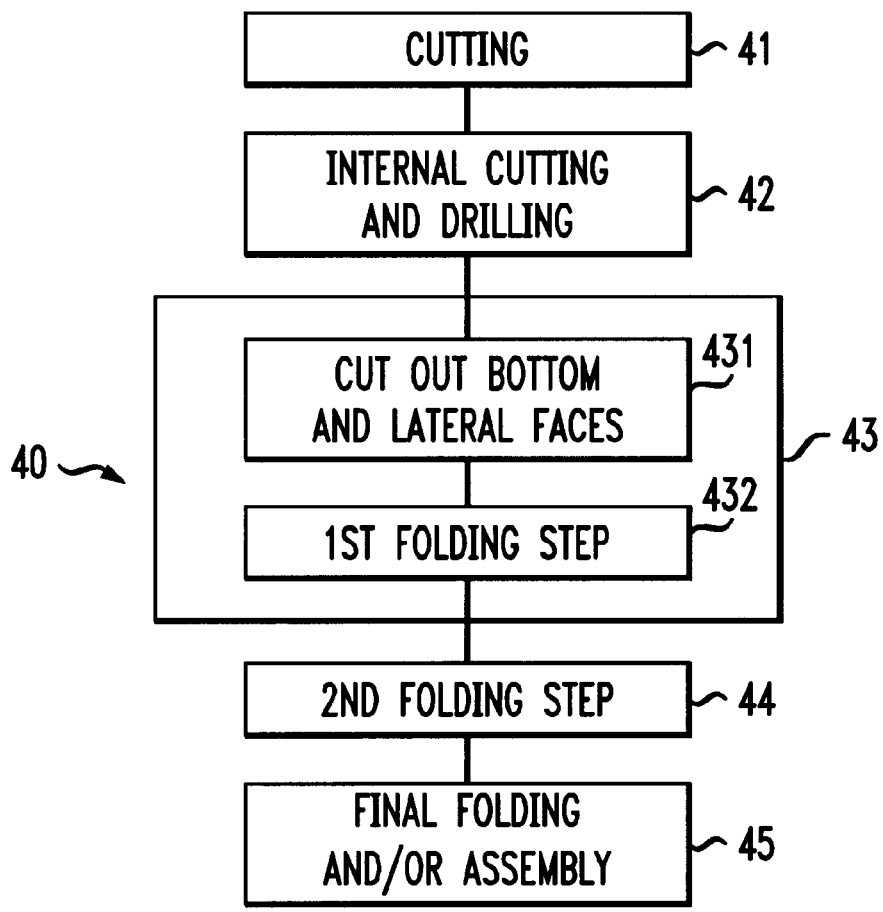
FIG. 4 is a simplified flow chart of a particular operational mode of a method according to the invention for the manufacture of the pack of FIG. 2.

As shown in the simplified flow chart of FIG. 4, in a particular mode of operation, the method 40 for the manufacture of pack 20 as described here above comprises:

in a standard way:
  a step 41 for cutting out one or more metal elements designed to form the continuous faces 21 to 25 of the pack 20;
  a step 42 for the internal cutting out or drilling of certain parts of the faces 21 to 25, especially to make the apertures 26 and 27 making it possible especially to lay connectors, for example of the PMCIA type and/or connectors for telephones and/or connectors for fax machines and/or any other type of appropriate connection.

According to the invention, the steps 41, 42 are then followed by a step referenced 43 which includes:

- a step 431 for the cutting out, in the face forming the bottom 25 and the lateral faces of the pack 20 referenced 21, 22, 23 of at least two supporting elements 28, 29, 214, 215;
- a first folding step 432 for the folding of each of the cut-out elements 28, 29, 214, 215 with respect to the face 21, 22, 23, 25 in which it is cut out;

at least one of the elements 28, 214 being cut out in dimensions and folded at a folding angle such that it forms an elastically mobile tongue 28 with respect to the face 25 in which it is cut out and at least one of the elements comprising a conductive part designed to co-operate electrically with at least one complementary element located on the board.

It must be noted that it is possible to limit the number of tools used to only one tool, namely a press enabling the substantially simultaneous performance of the cutting-out and folding steps 431, 432. Indeed, in a feed motion, the press makes it possible to cut out each of the elements 28, 29, 214, 215 and then, by the weight that it exerts, to fold each element, while it is being cut out, in this same feed motion.

When the cutting out and folding steps 431, 432 have been done, a second folding step is performed on at least certain cut-out elements 214. These elements 214, which are cut out with an "L" shaped face, then each have a part 214b designed to hold an electrical or electronic board "suspended" within the pack (i.e. located at a distance from the lower face or faces 25 and/or upper face or faces of the pack 20 such that only one element 214 cut out from a lateral face of the pack 20 can be used as a supporting means).

It will be noted that the elasticity of the supporting elements 28, 214 permits tolerances, especially as regards their dimensions and shaping, that are bigger than those required for example on an electrically conductive spacer 11 (described with reference to FIG. 1). It is therefore easier and less costly to manufacture the pack of the invention than prior art packs.

Finally the manufacturing method also comprises a step 45 for the folding and/or assembling of cut-out metal elements so as to position the faces 21 to 25 with respect to each other in order to form the pack 20 to be made.

Figure 5:
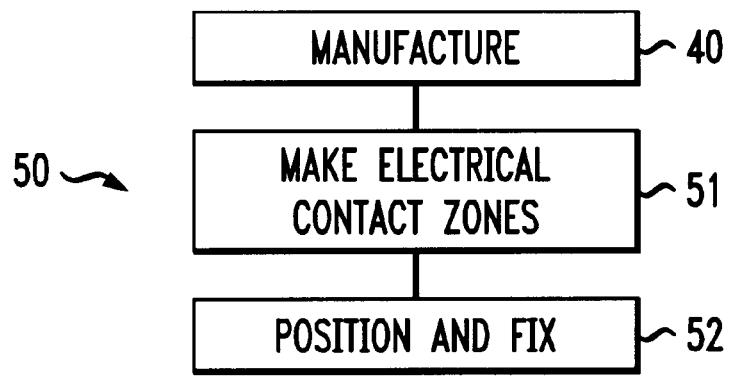
FIG. 5 is a simplified flow chart of a particular operational mode of the method according to the invention for the assembly of an electronic system comprising at least one pack and at least one electrical and/or electronic board.

A brief description is given here below, with reference to the simplified flow chart of FIG. 5, of a particular mode of operation of a method for the assembly of an electronic system comprising at least one pack 20 and at least one electronic board.

According to the invention, the method of assembly 50 comprises at least some of the following steps:

- a step 40 for the manufacture of the pack 20 explained here above with reference to the FIG. 4;
- a step 51 for the making, on each board, of at least one electrical contact zone. Each electrical contact zone is designed to work for example with one of the supporting elements 28, 29, 214, 215 comprising an electrically conductive part of the manufactured pack 20 so as to ground the board or boards;
- a step 52 for the positioning and fixing of each board in the pack 20. This positioning and fixing step 52 comprises:
  - the insertion, at an angle of insertion of less than 20 degrees, of the front part of the board concerned so that it abuts the lateral face referenced 22 between at least two the supporting elements referenced 28 and 29 (for the mother board) or 214 and 29 (for the daughter board); and
  - the lowering of the rear part of the mother board in allowing it to be guided along the mobile tongues 215 of the lateral faces referenced 21 and 23 until it extends beneath the tongues 215 in order to securely hold the mother board within the pack 20 beneath tongues 215 of this kind.

The supporting elements referenced 28, 29 and/or 215 or 214 and 29 by themselves provide for the vertical positioning of the board concerned within the pack 20. At least one of the supporting elements referenced 28, 29 and/or 215 or 214 and 29, is elastic, in order to remain in mechanical contact with the concerned board.

It will be recalled that at least one element 211 cut out in the bottom 25 of the pack 20 can be used as a bottom stop especially to prevent a deformation of the elastic supporting elements 28 (for example owing to the mass of the mother board) in such a way that these elements can no longer exert their elasticity.

At least one of the supporting elements referenced 28, 29 and/or 215, or 214 and 29, comprises a conductive part designed to co-operate electrically with the electrical contact zone located on the board concerned.

It is important to note that a simple substantially horizontal insertion of the board to be introduced and plugged in is enough to introduce and secure it between the supporting elements referenced 28, 29 and/or 215, or 214 and 29, inside the pack. It is therefore not necessary to plan for an additional step to fix the board to the pack. The mounting of the board in the pack is therefore simple and requires no specific tool.

It can be understood that the dismounting of the board too requires no tool.

The embodiment presented here above is not designed to limit the scope of the invention. It is therefore possible to make numerous modifications in the invention without departing from its framewok. In particular, it will be noted that the supporting elements 28, 29, 214 and 215 could have shapes different from the ones presented. As elastic supporting elements 28, 214 or rigid supporting elements 215, it is possible for example to provide for an end shape that is similar, for example, to that of a "7" providing especially for a more efficient horizontal securing of the board concerned, with the pack 20.

What is claimed is:

1. A pack designed to receive at least one electronic board, said pack comprising:
   - a continuous face for underlying the at least one electronic board;
   - a wall perpendicularly attached to the continuing face;
   - at least one elastic supporting structure formed by an element cut and folded out of the continuous face of the pack; and
   - at least one rigid supporting structure formed by an element cut and folded out of the perpendicular wall;
   - whereby the at least one elastic supporting structure and the at least one rigid structure are capable of respectively engaging a first face and a second face of the electronic board in a cooperative manner to rigidly position the at least one electronic board within the pack.

2. The pack according to claim 1, wherein at least one of said cut-out elements cut and folded out of the continuing face is shaped with dimensions and folding angles such that it forms a tongue that is elastically mobile with respect to said face from which it is cut out.

3. The pack according to claim 2, wherein said folding angle ranges from 2 to 70 degrees.

4. The pack according to any one of the claims 2 and 3, wherein the length of said elastically mobile tongue is at least 3 times greater than the width of this same tongue, said width of this tongue being itself at least 3 times greater than the thickness of said tongue.

5. The pack according to claim 2, wherein at least one cut-out element has, in a plane perpendicular to said face of the pack in which it is cut out, a face shaped as an "L" whose external end terminates in a folded part so that at least one of the arms of said face shaped as an L and said folded part is elastically mobile.

6. The pack according to claim 1, wherein at least one of said at least one elastic supporting structures has a conductive portion designed to electrically cooperate with the at least one electronic board.

7. The pack according to claim 6, wherein at least one elastic supporting structure having a conductive portion designed to electrically cooperate with the at least one electronic board is formed by an element cut and folded out of the perpendicular wall and is elastically mobile with respect to the continuing face.

8. The pack according to claim 7 wherein the at least one elastic supporting structure having a conductive portion are plural, the plurality being positioned to engage said first and second faces of the electronic board and sufficient in number to provide protection in transmission and reception against electromagnetic pollution.

* * * * *